Oct. 14, 1969 J. MANDELKORN 3,472,698

SILICON SOLAR CELL WITH COVER GLASS BONDED
TO CELL BY METAL PATTERN
Filed May 18, 1967

INVENTORS
MANDELKORN, JOSEPH

BY [signature]
Gene E. Shook

ATTORNEYS

United States Patent Office 3,472,698

Patented Oct. 14, 1969

3,472,698

SILICON SOLAR CELL WITH COVER GLASS BONDED TO CELL BY METAL PATTERN

Joseph Mandelkorn, Cleveland Heights, Ohio, assignor to the United States of America as represented by the Administrator of the National Aeronautics and Space Administration Filed May 18, 1967, Ser. No. 641,420
Int. Cl. H01m 27/04
U.S. Cl. 136—89 8 Claims

ABSTRACT OF THE DISCLOSURE

Cover glasses are attached to solar cells without using adhesives. Each cover glass is metallized in a pattern identical to the top contact pattern of a solar cell. The glass is bonded to the cell only within the metallized regions of glass and cell.

The invention described herein was made by an employee of the United States Government and may be manufactured and used by or for the Government for governmental purposes without the payment of any royalties thereon or therefor.

This invention is concerned with a glass covered solar cell for space applications. The invention is particularly directed to the attachment of a glass cover to a silicon solar cell.

Improved silicon solar cells having extremely shallow junctions have been developed for use in outer space. These cells have a junction depth less than about 0.5 micron and exhibit superior short wavelength response. The short wavelength response of a cell designed for space use, such as in a satellite power supply, is important because high short wavelength response increases the output of the cell. Also, when the cell is exposed to bombardment by high energy atomic particles in space, the long wavelength response is reduced while the short wavelength response remains unaltered.

Silicon cells used in space applications are covered with quartz or other transparent glasses. These cover glasses aid in the dissipation of heat from the illuminated cell and minimize damage from bombarding particles. The adhesives used to attach the cover glasses to the cells tend to degenerate under short wavelength radiation. Reflective coatings have been applied to the bottoms of the cover glasses to reflect short wavelength energy away from the adhesives and prevent this degeneration. When this is done the reflected short wavelength energy is lost to the cells, and it is not feasible to use the improved shallow junction cells under such conditions.

These problems have been solved by attaching cover glasses to shallow junction solar cells in accordance with the present invention wherein the cover glass is metallized in a pattern which is identical to the top contact pattern of the cell. The cover glasses are then bonded to the cells only within the metallized regions of the glass and cell. In this manner, there is no loss of active cell surface. Also, the adhesives and the bottom coatings on the cover glasses are not required.

It is, therefore, an object of the present invention to provide a covered solar cell with an extremely shallow junction.

Another object of the invention is to provide a bond for attaching a cover glass to a solar cell which will withstand temperature cycling without weakening.

A still further object of the invention is to provide an improved covered silicon solar cell having high quality junctions, high short-wavelength response, cover glass protection, and superior radiation damage resistance.

These and other objects of the invention will be apparent from the specification which follows and from the drawings wherein like numerals are used throughout to identify like parts.

Figures 1, 2, 3:
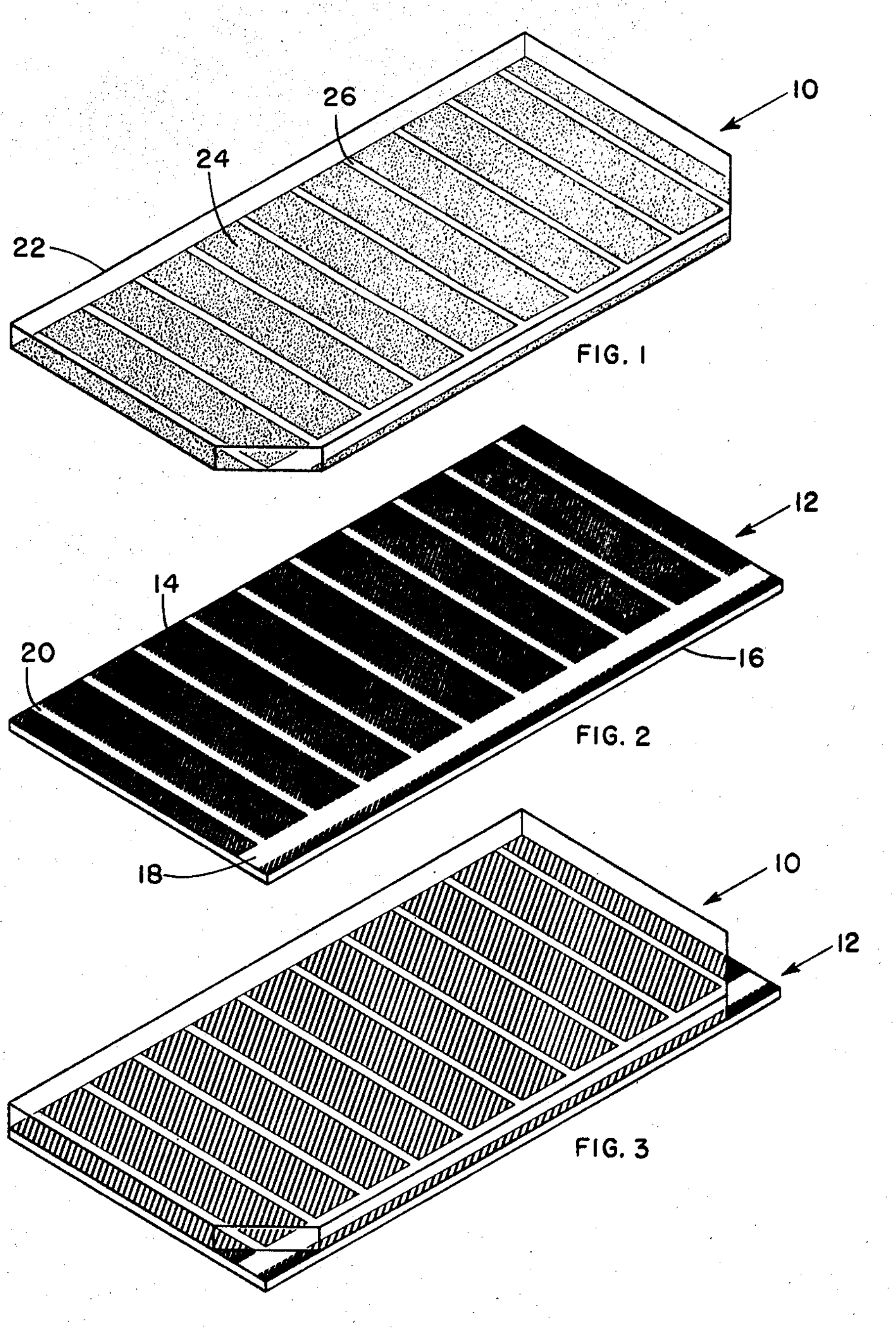
FIG. 1 is a perspective view of a cover glass showing the metallized pattern used in forming the attachment to a solar cell.
FIG. 2 is a perspective view of a solar cell to be covered showing the pattern of the top contact.
FIG. 3 is a perspective view of a covered solar cell.

Referring now to the drawings, a cover glass 10 shown in FIG. 1 and a solar cell 12 shown in FIG. 2 are assembled and bonded together in accordance with the invention to form a covered solar cell shown in FIG. 3. Certain semiconductor materials have improved resistance to radiation damage and are especially useful for solar cells to be used in space applications. Such semiconductor materials are described in copending application Ser. No. 349,777, filed Mar. 5, 1964, and now abandoned, and application Ser. No. 352,692, filed Mar. 17, 1964, and now abandoned for continuation Ser. No. 352,692, now Patent No. 3,390,020. The preferred material for the solar cell 12 is aluminum-doped, oxygen-free silicon.

Each solar cell 12 is prepared by masking active areas 14 on a surface of a wafer 16 of a semiconductor material which may be of the type described above having a shallow junction less than 0.5 micron below this surface. A main contact 18 and grid fingers 20 are formed by mounting the masked wafer 16 in a suitable holder, such as a jig, and evaporating a thin layer of a rare earth metal, such as cerium, onto the unmasked portions of the surface. This is followed by a similar evaporation of a thicker layer of silver. This cerium-silver contact is more thoroughly described in copending application Ser. No. 551,846, which was filed May 17, 1966, and now Patent No. 3,434,885.

The grid fingers 20 reduce the parasitic resistance losses in the extremely shallow top *n* region of the cell 12. The grid fingers 20 also serve to provide paths for conduction of heat to discrete sections of the cover glass 10.

To minimize reflection from the cell, an antireflective coating is applied in a vacuum at a pressure of approximately $10^{-5}$ mm. This is accomplished by removing the cell from the jig and mounting it in a holder. The entire top surface of the cell 12 is exposed with the exception of the main contact 18. The cell 12 is heated to a temperature of about 300° C. Silicon monoxide is evaporated slowly from an evaporation container until the cell surface changes to a light golden color. This occurs when the SiO thickness is approximately 500 Angstroms. At this point magnesium fluoride in a holder adjacent to the silicon monoxide holder is heated and evaporated until a bluish violet color is obtained on the cell surface. This occurs when the approximate overall thickness of both layers is about 1000 Angstroms. The heating of the cell during evaporation minimizes the adherence of the coating to the contact 18 and grid fingers 20.

Reflection from the cover glass 10 can be minimized by coating its surfaces in a similar manner. For optimum results the cover glass 10 is preferably coated on the top and bottom with a layer of magnesium fluoride.

Adherent contacts to each of the cover glasses 10 are prepared by masking a coated slip 22 of glass or quartz in certain areas 24. The masked slip 22 is placed in the same jig or holder used to prepare the cell 12. A metallized pattern 26 is formed by evaporating a thin layer of titanium or cerium followed by a thicker layer of silver onto the unmasked portions of the blank.

The cover glass 10 is then attached to the solar cell 12 to form the assembly shown in FIG. 3. This is done by thermal compression bonding, by welding, or by soldering the respective metallized layers. When the coated cell 12 is solder dipped prior to attaching the cover glass 10 the solder adheres to the contact and grid areas even though these areas were previously coated when the masking was removed.

By metallizing the cover glass 10 in the exact configuration of the cell top contact, the bonding region between the cover glass 10 and the cell 12 does not extend into the active area 14 of the cell surface. Therefore, there will be no loss in cell current due to mounting of the cover glass.

The effectiveness of the cover glass 10 in reducing the temperature of the cell 12 will depend on the conduction of the heat from the cell through the top contact configuration of the cover glass. Because there is bonding of the cover glass and cell surface only at the cell contact and because quartz and other glass do not have high thermal conductivity, it is advisable to utilize a gridded contact configuration for the assembly shown in FIG. 3. In this manner, the cover glass 10 will be bonded to the cell 12 at discretely spaced intervals, and conduction of heat to the cover glass will be most effective.

There is no need to bond using only metals or solder, although it is advisable to bond the materials which permit adequate thermal conductivity from solar cell to cover glass. The bonding materials are chosen to be the most suitable match, in terms of contraction and expansion, between the cover glass and the silicon cell.

Although several preferred embodiments have been described, it will be appreciated that various other modifications can be made without departing from the spirit of the invention or the scope of the subjoined claims.

What is claimed is:

1. A covered solar cell comprising a wafer of an aluminum-doped, oxygen-free silicon having a junction depth less than about 0.5 micron, a metal contact on a surface of said wafer adjacent active areas thereof, a preformed transparent glass cover over said surface of said wafer, and a metal pattern on the surface of said transparent cover facing said wafer, said metal pattern having substantially the same configuration as said contact on said surface of said wafer, said metal pattern being bonded to said metal contact for rigidly securing said transparent glass cover to said wafer whereby the bonding region between said cover and said wafer extends only along the facing surfaces of said metal pattern and said metal contact.

2. A covered solar cell as claimed in claim 1 wherein the contact on the surface of the wafer and the pattern on the transparent glass cover are the same metals.

3. A covered solar cell as claimed in claim 1 including a main metal contact adjacent one edge of the surface of the wafer and a plurality of grid fingers extending across said surface from said main contact to reduce the parasitic resistance losses in the extremely shallow top *n* region of the cell and to provide a path for conduction of heat to discrete sections of said transparent cover.

4. A covered solar cell as claimed in claim 3 wherein the main contact and grid fingers are cerium-silver.

5. A covered solar cell as claimed in claim 1 including an antireflective coating over the active area of the cell surface and the adjacent metal contact.

6. A covered solar cell as claimed in claim 5 wherein the antireflective coating comprises a layer of silicon monoxide and a layer of magnesium fluoride.

7. A covered solar cell as claimed in claim 1 including an antireflective coating on the transparent glass cover.

8. A covered solar cell as claimed in claim 7 including a cover glass having a layer of magnesium fluoride on the top and bottom surfaces thereof.

References Cited

UNITED STATES PATENTS

| | | | |
|---|---|---|---|
| 2,779,811 | 1/1957 | Picciano et al. | 136—89 |
| 2,794,846 | 6/1957 | Fuller | 136—89 |
| 3,076,861 | 2/1963 | Samulon et al. | 136—89 |
| 3,164,795 | 1/1965 | Suebbe | 136—89 |
| 3,247,428 | 4/1966 | Perri et al. | 136—89 X |
| 3,361,594 | 1/1968 | Iles et al. | 136—89 |
| 3,390,020 | 6/1968 | Mandelkorn | 136—89 X |
| 3,434,885 | 3/1969 | Mandelkorn et al. | 136—89 |

OTHER REFERENCES

Cambell: Proc. 17 Ann. Power Sources Conf., October 1963, pp. 19–22.

Ralph et al., IEEE Trans. on Electron Devices, September 1965, vol. ed. 12, No. 9, pp. 493–496.

WINSTON A. DOUGLAS, Primary Examiner

A. BEKELMAN, Assistant Examiner

U.S. Cl. X.R.

29—572